United States Patent [19]

Fleming et al.

[11] 4,152,658

[45] May 1, 1979

[54] RESISTIVE FILM STABILIZATION OF COPLANAR AMP DEVICE

[75] Inventors: Paul L. Fleming, Rockville; Henry E. Carlson, Glen Burnie, both of Md.

[73] Assignee: Communications Satellite Corporation, Washington, D.C.

[21] Appl. No.: 879,928

[22] Filed: Feb. 22, 1978

[51] Int. Cl.² .............................................. H03F 3/04
[52] U.S. Cl. .......................................... 330/5; 330/53
[58] Field of Search .............................................. 330/5

[56] References Cited

U.S. PATENT DOCUMENTS

| | | | |
|---|---|---|---|
| 3,833,858 | 9/1974 | Gandhi et al. | 330/5 |
| 3,975,690 | 8/1976 | Fleming | 330/5 |

Primary Examiner—Darwin R. Hostetter
Attorney, Agent, or Firm—Sughrue, Rothwell, Mion, Zinn and Macpeak

[57] ABSTRACT

Undesirable odd mode oscillations in coplanar active medium propagation (AMP) devices are suppressed, and transmission of the desired even mode signal is enhanced by placing a planar resistance element beneath the substrate supporting the Gunn epitaxial layer.

13 Claims, 6 Drawing Figures

RESISTIVE FILM STABILIZATION OF COPLANAR AMP DEVICE

BACKGROUND OF THE INVENTION

The Active Medium Propagation (AMP) device is a planar traveling waveguide in which amplification of a propagating RF wave takes place. Such devices were only recently developed, and a detailed description can be had by referring to U.S. Pat. No. 3,975,690 and to P. L. Fleming, "The Active Medium Propagation Device," *Proc. IEEE*, Volume 63, No. 8, pp. 1253-1254, August 1975. This invention relates to the coplanar version of the AMP device. Briefly described, the coplanar AMP device comprises a set of three conductors applied to the surface of an epitaxial layer of lightly doped ($\approx 10^{15}$cm$^{-3}$), n-type GaAs which was grown on a substrate of semi-insulating GaAs. When the conductors are biased to provide a high enough electric field, electrons in the epitaxial layer are given sufficient energy to promote them into a conduction band valley where their mobility is less than when they are in the lower conduction band valley. This results in a negative value for the differential mobility, and an RF wave propagating in the GaAs will gain in amplitude rather than suffer attentuation. Due to the extremely small dimensions of the center conductor, for example, 7.0µ, it is extremely difficult to connect the center conductor of a coaxial cable to the center conductor of the AMP device. In order to facilitate such connections, the device can be fabricated having a pair of "launch" regions in which the center conductor is flaired outwardly. The dimensions of the electrodes and the inter-electrode gaps in some AMP devices—e.g., those known as AMP III devices—are such that negative differential mobility cannot be achieved in the launch regions, thus giving rise to the terms "launch" region and "active" region, the former term being defined as above, and the latter term being defined as that central portion of the AMP III device within which a propagating RF signal is amplified. In later devices, known as AMP IV devices, the inter-electrode spacing is such that negative differential mobility can be achieved in both the launch and central portions of the device. Thus, the active region in AMP IV would include the launch regions and the central portions of the device.

FIG. 1 is a top view of a coplanar AMP IV device mounted on a coplanar MIC board. The AMP device includes a center conductor 14 and a pair of ground conductors 15 and 16 spaced from either side of the center conductor to form a pair of gaps 18. The portion 20 of the AMP device located between the dotted lines 22 and 24 is the central portion of the device, and the portions 26 and 28 are the launch regions. The MIC board, which may, for example, consist of an alumina substrate having a copper-plated heat sink on the upper surface, is divided into two outer electrodes 30 and 32 and a pair of center electrodes 34 and 36 by the gaps 38, 40, 42 and 44. The ground conductors 15 and 16 of the AMP device are connected to the outer conductors 30 and 32 of the MIC board by quantities of silver epoxy 46 and 48, respectively, and the center conductor 14 of the AMP device is connected at either end to the center conductors 34 and 36 of the MIC board by means of connecting wires 50. Coaxial cables 48 may be connected to the outer extremities of the MIC board conductors by coaxial launchers 51. The dimensions of the electrodes 14, 15 and 16 and the inter-electrode gaps 18 in the launch regions 26 and 28 of the AMP device are not only designed to facilitate connection of the electrodes to the surrounding RF circuitry, but are also designed to provide a smooth impedance transition between the central portion 20 of the coplanar AMP transmission line and the surrounding circuitry.

FIG. 2 is a cross-sectional view along lines 2—2 of FIG. 1 showing the substrate 10, epitaxial layer 12, outer electrodes 15 and 16 and center electrode 14 of the active region of the AMP device. The ground electrodes 15 and 16 are connected to the copper-plated outer electrodes 30 and 32 at the upper surface of the alumina substrate 52 of the MIC board by quantities of silver epoxy 46 and 48.

The RF signal intended to be amplified in the active region of the AMP device is an even mode signal—i.e., the RF signal applied to the center conductor 14 will give rise to electric field components 54 and 56 between the center electrode 14 and the adjacent ground conductors 15 and 16, respectively. The field components are symmetrical about a plane of symmetry 58 extending vertically through the center of the conductor 16. Since the electric field in the epitaxial layer 12 is dependent upon the conditions within the epitaxial layer, it will be apparent to anyone of ordinary skill in the art that the epitaxial layer must be perfectly uniform in the vicinity of the plane of symmetry 58 in order for a pure even mode signal to exist. In reality, however, slight imperfections and non uniformities often exist in the epitaxial layer, giving rise to an "odd" mode signal—i.e., an RF signal propagating in the epitaxial layer having asymmetrical electric field components. The asymmetrical electric field components of the odd mode signal do not cancel each other, and, therefore, the net electric field 60 will create a potential difference between the ground conductors 15 and 16. The existence of both even and odd mode signals in the AMP device results in a "mixed" mode signal—i.e., the combination of both even and odd mode signals—propagating along the AMP device and MIC board. Since the coaxial launchers 51, for connecting the coaxial cables 49 to the MIC board, are designed to provide impedance matching only for even mode signals, they present a higher reflection to the odd mode signal. The successive reflection and amplification of the odd mode signals in the AMP device results in a odd mode oscillation which interferes with and limits the amplification of the desired even mode signal.

Assuming equal gain for both modes, we can write the amplitude criteria for oscillation in the propagation direction as follows:

For even mode, $$|K_1|e^{\alpha l} \geq 1.0 \qquad (1)$$

and for odd mode, $$|K_2|e^{\alpha l} \geq 1.0 \qquad (2)$$

where $K_1$ is the reflection coefficient of the coaxial launchers for even mode signals, $K_2$ is the reflection coefficient of the coaxial launchers for odd mode signals, $\alpha$ is the gain factor of the AMP device for both modes, and $l$ is the length of the active region of the AMP device. Since $|K_2| \geq |K_1|$, odd mode oscillation on the MIC board can occur, limiting the desired even mode signal.

Assuming that an oscillation cavity is formed between the coaxial launchers at either end of an MIC board having a length of one inch, and we can calculate, in a manner well known in the art, the frequency of TEM-type modes which have an E field maximum at the center of the board. The results are shown in the following table.

TABLE 1

| Coaxial Launcher Separation | f(GHz) |
| --- | --- |
| $\lambda/2$ | 1.905 |
| $\lambda$ | 3.81 |
| $3\lambda/2$ | 5.71 |
| $2\lambda$ | 7.62 |
| $5\lambda/2$ | 9.52 |
| $3\lambda$ | 11.43 |
| $7\lambda/2$ | 13.32 |
| $4\lambda$ | 15.24 |
| $9\lambda/2$ | 17.13 |
| $5\lambda$ | 19.05 |

Thus, the "cavity" will support oscillations at any of the frequencies in the right-hand column. The AMP IV devices mounted on the MIC board have typically oscillated in the range of 13–14 GHz. As can be seen in Table 1, the $7\lambda/2$ mode is a good match to the observed frequencies.

Besides causing oscillation, the odd mode signal may also result in rf radiation from the gaps of the coplanar AMP device. No radiation of the even mode signal will occur since the E field components at all points along the plane of symmetry cancel each other; however, due to the imbalance of the E field components of the odd mode signal, a measurable E field will exist at points distant from the center conductor.

SUMMARY OF THE INVENTION

Accordingly, it is an object of the present invention to provide a means for suppressing the odd mode oscillation in an AMP device, thereby enhancing the efficiency of the device with respect to even mode signals and substantially decreasing the RF radiation from the gaps.

Briefly, this is achieved by providing a resistive load to the odd mode signal in the form of a planar resistive element beneath the Gunn layer. The odd mode, which extends further below the electrodes than the even mode, encounters the resistive element and is attenuated, while the even mode, which penetrates about 5–10μ into the epitaxial layer, sees no resistance and suffers no attenuation. The attenuation of the odd mode signal reduces the interfering oscillation, thereby further enhancing the desirable even mode signal.

DETAILED DESCRIPTION OF THE PREFERRED EMBODIMENT

Figure 1:
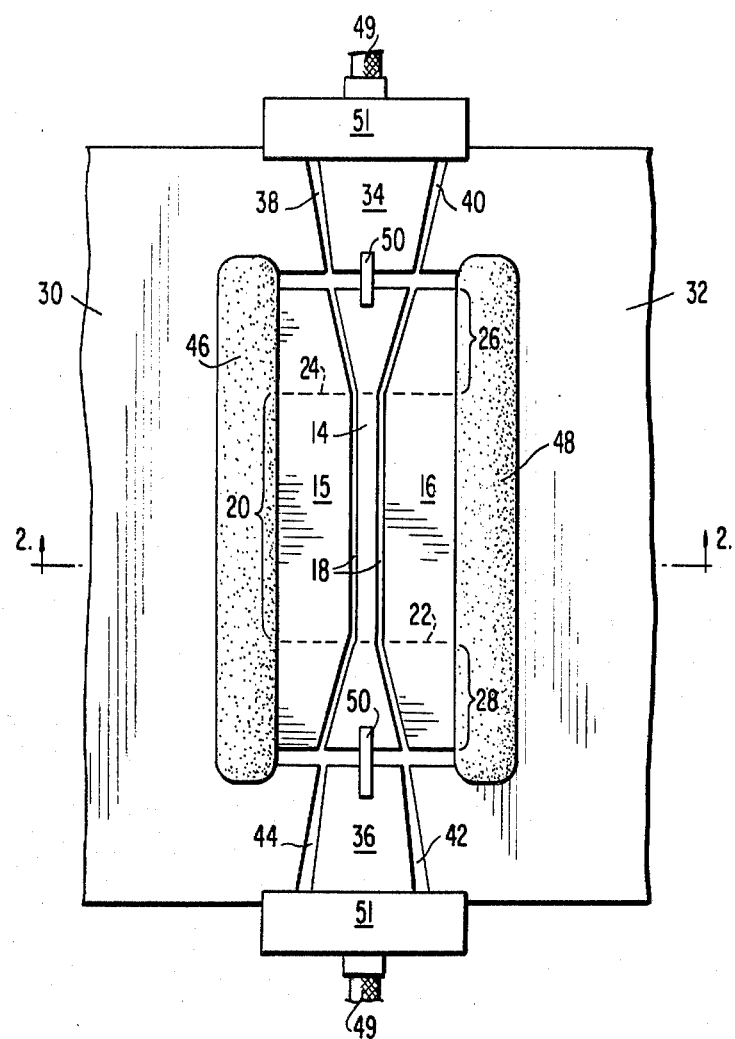
FIG. 1 is a top view of a coplanar AMP IV device mounted on a coplanar MIC board.
Figure 3:
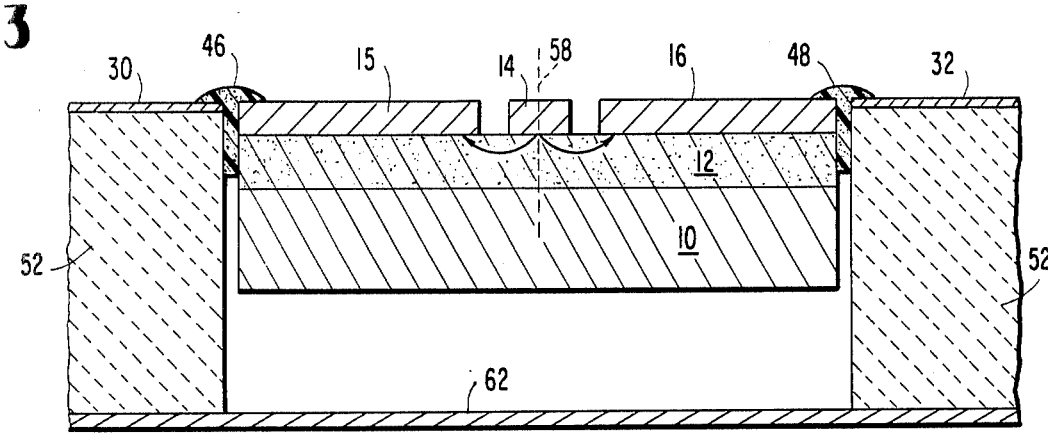
FIG. 3 is a cross-sectional view similar to FIG. 2 further illustrating the resistive film stabilization of the AMP device.

FIG. 3 is a cross-sectional view along lines 2—2 of FIG. 1 and shows one method of achieving resistive film stabilization of an AMP device. Attenuation of the odd mode oscillation signal is achieved by providing a planar resistive element 62 at the bottom surface of the MIC board covering the entire area directly beneath the AMP device. A suitable resistive element is a Metal Film Mylar Resistance Card obtainable from Film Ohm Division, Solitron Microwave. The latter resistive element has the property of suppressing the oscillation mode signal while minimally effecting the desired even mode signal. This property is apparently due to the depth of penetration of the odd mode signal being substantially greater than that of the even mode signal, which is confined to approximately the top 5–10μ of the epitaxial layer 12.

Figure 2:
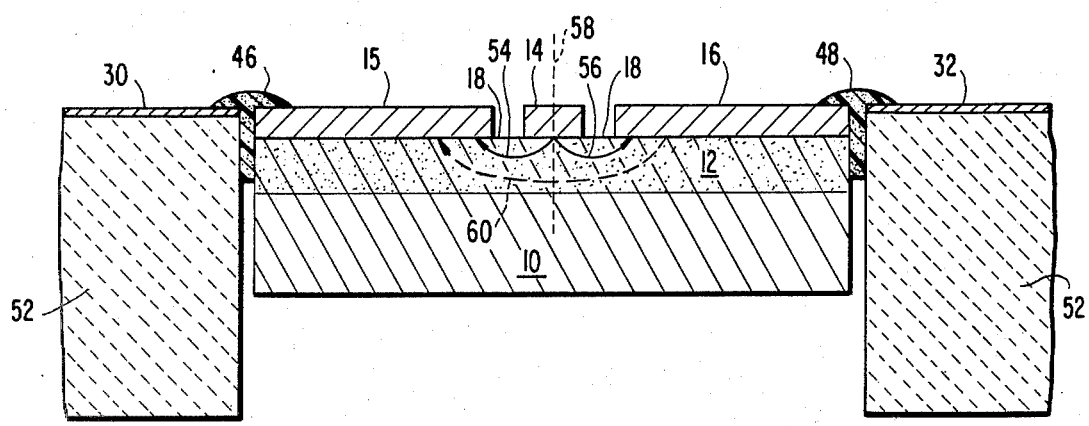
FIG. 2 is a cross-sectional view along lines 2—2 of FIG. 1.

The electric field 60 between the ground conductors is illustrated in FIG. 2 as only penetrating deeply into the epitaxial layer 12. However, it will be understood by one of ordinary skill in the art that, since there is no grounded shield to confine the electric field, the electric field 60 will exist as well as points far distant from the conductors 15 and 16. Its strength will be diminished with increasing distance from the conductors. The resistive element 62, in order to attenuate this electric field 60 should be close enough to the upper surface of the AMP device so that it cuts through a sufficient amount of the electric field, but it should be far enough removed from the upper surface of the AMP device in order to avoid attenuation of the even mode signals which, since they cancel one another, are limited to a relatively small depth in the epitaxial layer 12.

The distance between the resistive element and the upper surface of the AMP device should preferably be between approximately 0.002 inch and 0.050 inch. The size of the resistive element 62 may be empirically determined—i.e., at some point, the additional attenuation of the odd mode signal provided by a larger resistive element will be exceeded by the minimal loss which results in the even mode signal. Generally, it is desirable to confine the resistive element 62 to the area underneath the AMP device.

Figure 4A:
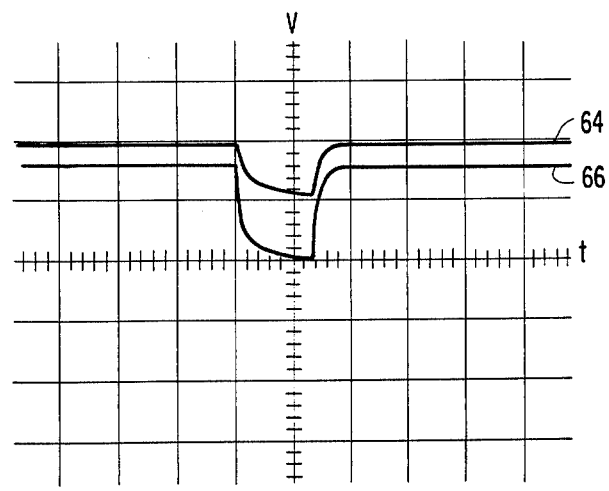
FIGS. 4a and 4b are graphs of the relative performance characteristics of a prior art AMP device and an AMP device having resistive film stabilization according to the present invention, respectively.

FIG. 4a is a picture of an oscilloscope display obtained during experimentation with an AMP IV device having no resistive film stabilization. This particular AMP device tested had a central portion length of 625μ, two launch regions totalling 625μ in length, a center conductor 12μ wide in the central portion, and 100μ wide at the outer ends of the launch regions and gap widths of 8μ throughout the entire length of the AMP device. The resistive element 62 was positioned approximately 0.025 inch beneath the upper surface of the AMP device. The input signal to the device was a 14 GHz signal modulated on-and-off by a 1 KHz square wave. The amplitude (vertical) scale of the graph of FIG. 4a is in arbitrary units, while the horizontal scale is 1.0μ sec/cm. The upper trace 64 illustrates the 13.6 GHz output oscillation signal with the input signal removed—i.e., during the "off" portion of the 1 KHz modulation signal. The lower trace 66 illustrates the output signal of the AMP device with the input signal on. It should be appreciated that the output signals are actually detected RF signals but, due to the very fast sweep time of the oscilloscope relative to the 1 KHz modulation frequency, only a single pulse is shown for each output signal.

Figure 4B:
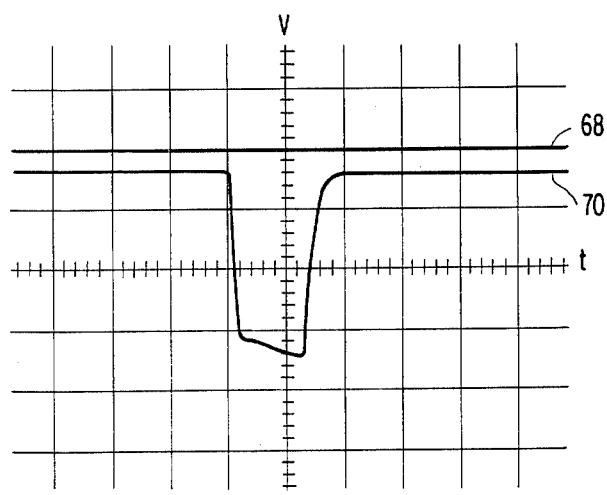

FIG. 4b is a picture of an oscilloscope plot obtained during experimentation with an AMP device, similar to that used in FIG. 4a, having resistive film stabilization according to the present invention. The upper trace 68 illustrates the suppressed oscillation output signal of the AMP device with the input signal removed, and the lower trace 70 illustrates the output of the AMP device with the input signal on. By comparison of curves 64 and 68, it will be apparent to one skilled in the art that resistive film stabilization according to the present invention suppresses the unwanted odd mode oscillation signal in the AMP device. By comparison of curves 66 and 70, it will also be apparent to one skilled in the art that the enhanced output signal of the AMP device obtained with resistive film stabilization represents approximately a 5 dB improvement over the AMP IV device illustrated in FIG. 4a. This effect has been demonstrated with 0.001 inch metal film mylar resistance cards having resistance values of 25, 50, 100 and 300 ohms per square.

In addition to enhancing the efficiency of the AMP device with respect to even mode signals, the resistive film stabilization also substantially eliminates troublesome RF radiation caused by the odd mode signal.

Figure 5:
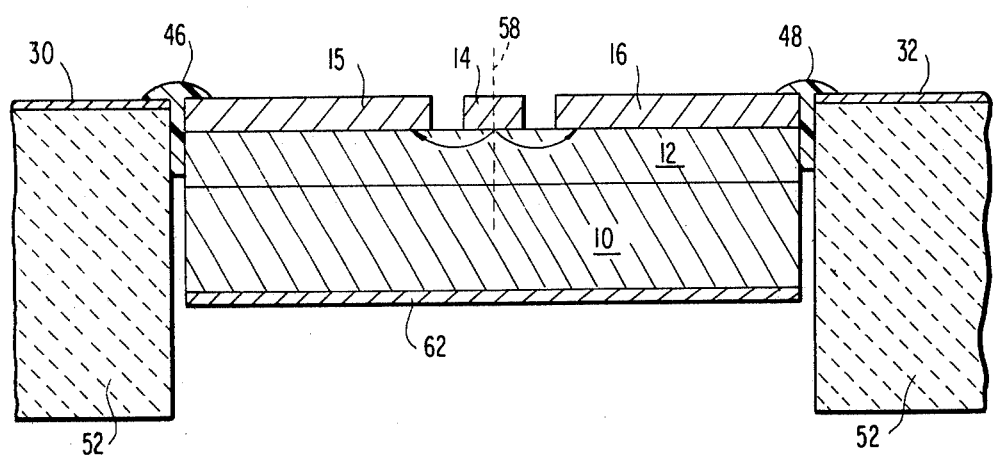
FIG. 5 is a cross-sectional view similar to FIG. 3 of a further embodiment of the present invention.

It will be obvious to one skilled in the art that the resistive film stabilization technique according to the present invention represents a novel contribution to the relatively new technology of coplanar AMP devices. It should also be appreciated that although the present invention has been described with reference to a particular embodiment, various change and modifications could be made without departing from the true spirit and scope of my invention. For example, rather than affixing a resistive card to the bottom of the MIC board, a resistive film could be deposited directly on the bottom surface of the semi-insulating substrate 10 of the AMP device as shown in FIG. 5.

What is claimed is:

1. In a RF transmission device of the type comprising a coplanar active medium propagation (AMP) device having first, second and third conductors overlying and forming ohmic contacts with a Gunn semiconductor layer grown on a semi-insulating substrate, said second and third conductors being spaced from either side of said first conductor to form gaps therebetween, said AMP device having an active region within which a propagating RF wave is amplified, said transmission device having coupling means for coupling said AMP device to surrounding RF circuitry, the improvement comprising:
    said transmission device further comprising a planar resistive element beneath said active region for attenuating odd mode oscillations in said AMP device.

2. A transmission device according to claim 1 wherein said AMP device further includes a first launch region for providing impedance matching and ease of connection between one end of said conductors and said coupling means, and wherein said planar resistive element extends beneath said first launch region.

3. A transmission device according to claim 2 wherein said AMP device further includes a second launch region for providing impedance matching and ease of connection between the remaining end of said conductors and said coupling means and wherein said planar resistive element extends beneath said second launch regions.

4. A transmission device according to claim 1 wherein said resistive element is spaced from the bottom of said semi-insulating substrate and parallel to said first, second and third conductors.

5. A transmission device according to claim 1 wherein said resistive element comprises a resistive film deposited on the bottom surface of said semi-insulating substrate.

6. A transmission device according to claim 1 wherein said coupling means includes coaxial connection means for connecting the center conductor of a coaxial cable to said first conductor.

7. A transmission device according to claim 1 wherein said coupling means comprises a board for supporting said AMP device, said board comprising a dielectric substrate having a plurality of conductors on the surface thereof.

8. A transmission device according to claim 7 wherein said board surrounds and supports said AMP device, said coupling means further comprising a coaxial connector for connecting the inner and outer conductors of a coaxial cable to said plurality of conductors on said board.

9. A transmission device according to claim 1 wherein said resistive element is positioned between approximately 0.002 inch and 0.050 inch from the upper surface of said Gunn semiconductor layer.

10. A method of suppressing odd mode oscillations in a coplanar active medium propagation (AMP) device of the type having first, second and third conductors overlying and forming ohmic contacts with a Gunn semiconductor layer, comprising:
    providing a planar resistive element beneath said Gunn semiconductor layer.

11. The method according to claim 10 wherein said Gunn semiconductor layer is grown on a semi-insulating substrate and wherein said providing step comprises:
    depositing a resistive film on the bottom surface of said semi-insulating substrate.

12. The method according to claim 10 wherein said Gunn semiconductor layer is grown on a semi-insulating substrate and wherein said planar resistive element is spaced from the bottom surface of said semi-insulating substrate and parallel to said first, second and third conductors.

13. The method according to claim 10 wherein said resistive element is positioned between approximately 0.002 inch and 0.050 inch from the upper surface of said Gunn semiconductor layer.

* * * * *